United States Patent [19]

Ezuka

[11] Patent Number: 5,189,353
[45] Date of Patent: Feb. 23, 1993

[54] RESOLVER SYSTEM

[75] Inventor: Yasuhiro Ezuka, Maebashi, Japan

[73] Assignee: Nippon Seiko Kabushiki Kaisha, Tokyo, Japan

[21] Appl. No.: 786,506

[22] Filed: Nov. 1, 1991

[30] Foreign Application Priority Data

Nov. 2, 1990 [JP] Japan .................................. 2-298473

[51] Int. Cl.$^5$ .......................................... H02K 24/00
[52] U.S. Cl. .................................... 318/605; 318/654; 341/116
[58] Field of Search ............... 318/605, 661, 603, 616, 318/654, 692; 310/168; 340/870.34; 364/167.01; 341/112, 116

[56] References Cited

U.S. PATENT DOCUMENTS 4,551,708 11/1985 Welburn .......................... 318/661 X
4,568,865 2/1986 Welburn .............................. 318/661
5,032,750 7/1991 Hayashi .................................. 310/83

FOREIGN PATENT DOCUMENTS 1-218344 8/1989 Japan .

Primary Examiner—Bentsu Ro
Attorney, Agent, or Firm—Frishauf, Holtz, Goodman & Woodward

[57] ABSTRACT

A resolver system includes a resolver having an annular rotor, and an annular stator arranged around the annular rotor in spaced relationship thereto. The rotor and the stator are arranged such that the reluctance of a space defined between the rotor and the stator varies with a change in the angular position of the rotor in such a fashion that one revolution of the rotor causes one cycle of a fundamental frequency component of variation of the reluctance.

The stator has formed thereon a plurality of pole shoes circumferentially arranged at intervals of 120° or 60° to form three of six phases, each of the pole shoes having a single kind of winding wound thereon. A servo driver applies an excitation signal to each of the windings on the pole shoes of the stator to excite same. Further, the servo driver is responsive to a value of current flowing in each of the windings which is variable with variation of the reluctance, for generating a speed signal indicative of the rotational speed of the rotor and a position signal indicative of the angular position of the rotor.

11 Claims, 8 Drawing Sheets

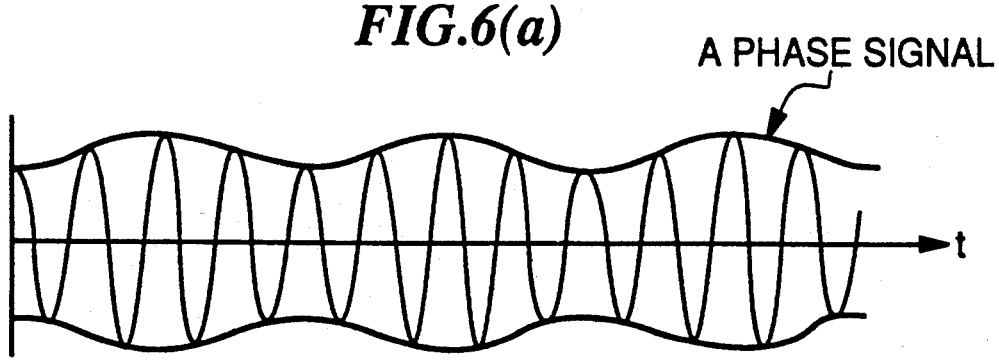
FIG.6(a) A PHASE SIGNAL
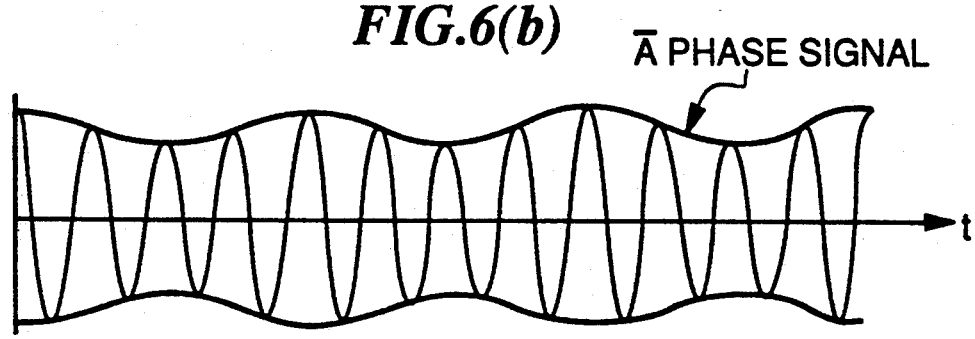
FIG.6(b) Ā PHASE SIGNAL
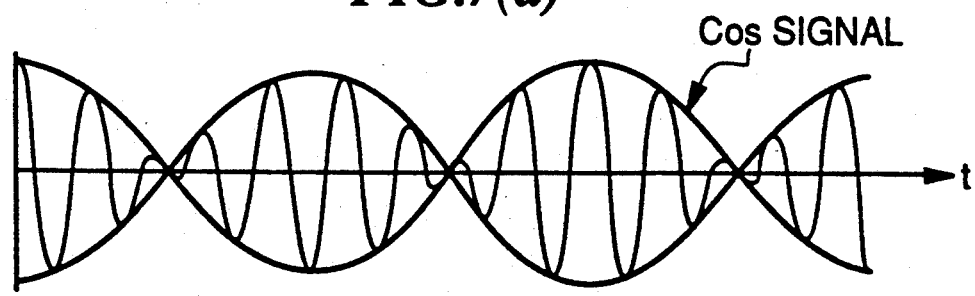
FIG.7(a) Cos SIGNAL
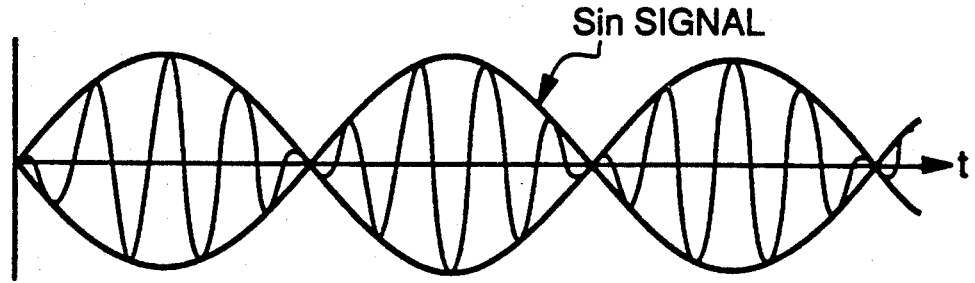
FIG.7(b) Sin SIGNAL

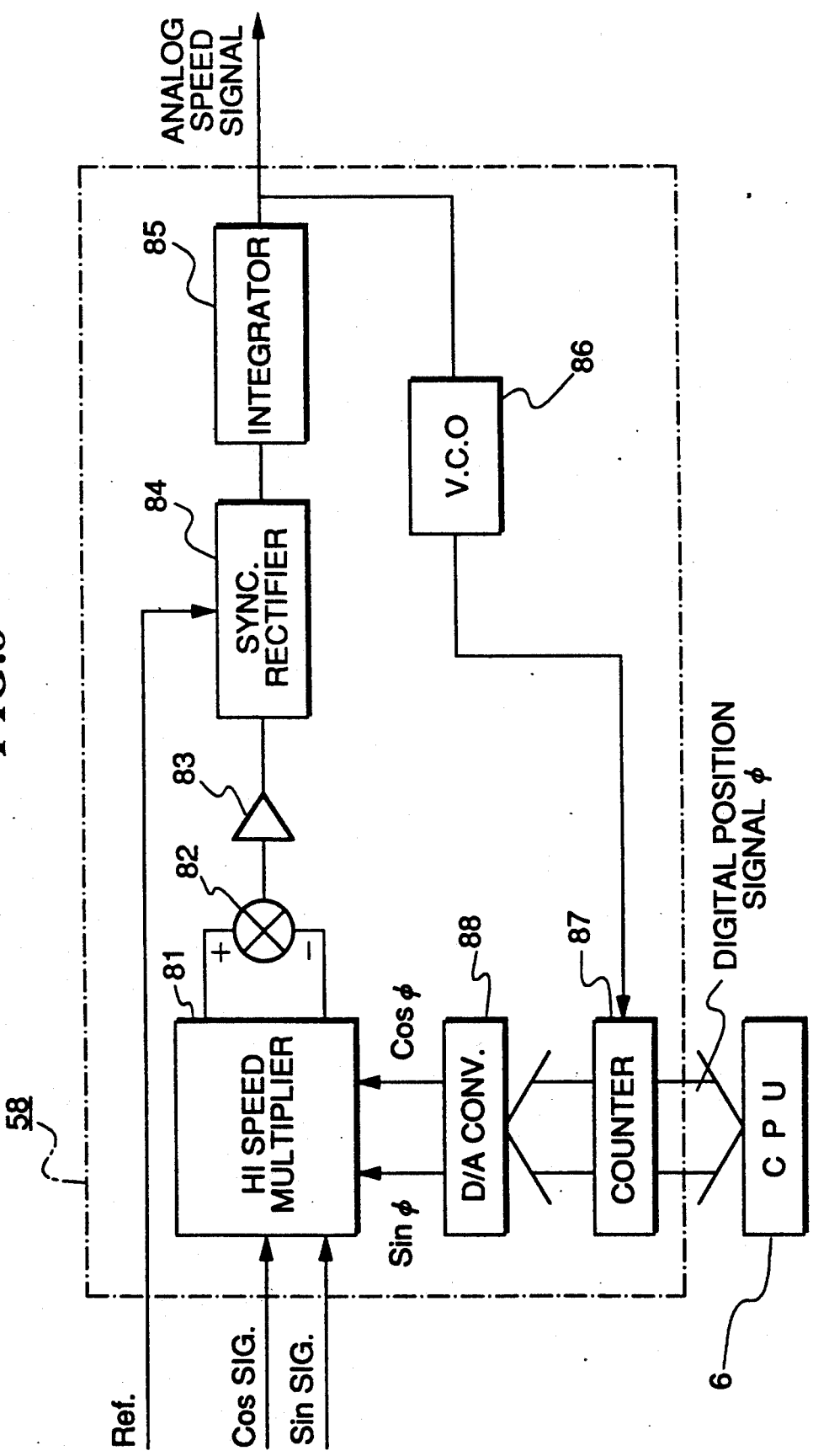

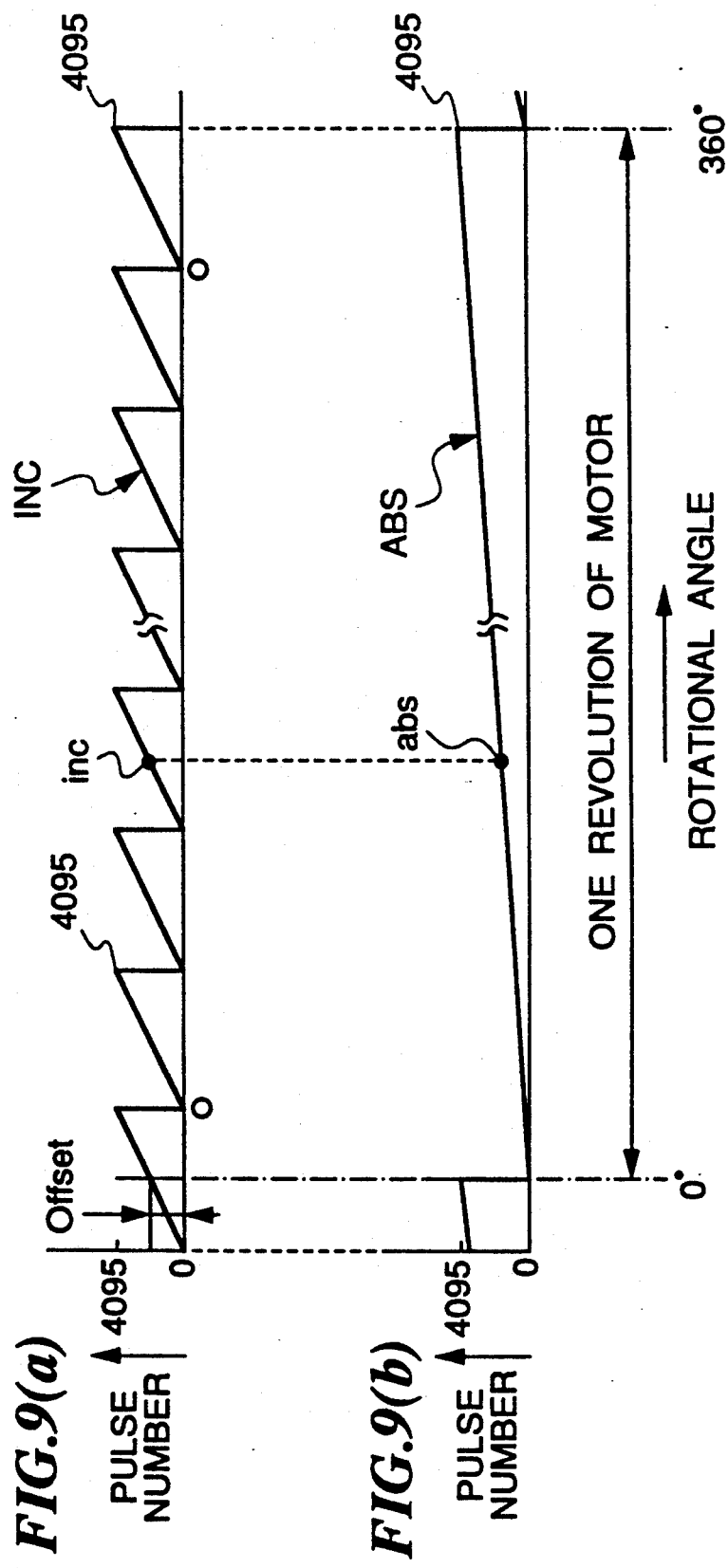

RESOLVER SYSTEM

BACKGROUND OF THE INVENTION

This invention relates to a resolver system for detecting the angular position and rotational speed of a rotating element.

Amongst conventional resolvers, a bipolar variable reluctance type resolver is known, e.g. from Japanese Provisional Patent Publication (Kokai) No. 1-218344, which comprises a rotor and a stator which are arranged such that the reluctance of a space between the rotor and pole shoes formed on the stator varies with a change in the angular position of the rotor in such a fashion that one revolution of the rotor causes one cycle of a fundamental wave of reluctance variation, wherein the reluctance variation is sensed to detect the angular position and/or rotational speed of the rotor, the stator having formed thereon three first pole shoes circumferentially arranged at intervals of 120°, the first pole shoes having wound thereon three-phase AC excitation windings and output windings, and three second pole shoes circumferentially arranged at locations diametrically opposite to respective ones of the first pole shoes, the second pole shoes having wound thereon three-phase AC excitation windings and output windings which have a reverse winding direction to that of the output windings on the first pole shoes, the six first and second pole shoes being generically called "the group A", the stator further having six pole shoes generically called "the group B" circumferentially arranged at locations deviated by 90° from respective ones of the pole shoes of the group A, the pole shoes of the group B having wound thereon AC excitation windings and output windings in an identical arrangement with the group A. The phase difference $(\theta + \pi/4)$ between an output voltage, which is obtained by synthesizing output voltages from the output windings of the groups A, B, and an excitation voltage applied to each of the excitation windings is detected, to detect the angular position $\theta$ of the rotor with reference to a reference position of $-\pi/4$.

However, according to the known resolver, each of the pole shoes formed on the stator is surrounded by both an excitation winding for forming a magnetic field and an output winding for detecting an output signal which has been phase-modulated by an amount corresponding to the rotational angle of the rotor. Therefore, a large space is required for accommodating the windings, resulting in an increased size of the whole resolver. Furthermore, the excitation winding and the output winding on each pole shoe has to be electrically insulated from each other, which requires an increased number of manufacturing steps as well as a complicated winding operation, leading to an increased manufacturing cost.

SUMMARY OF THE INVENTION

It is an object of the invention to provide a resolver system which has a reduced space for accommodating windings wound on pole shoes of the stator, and hence is compact in size as a whole, as well as facilitates its assemblage into or with a driving motor, etc.

It is a further object of the invention to provide a resolver system which requires a reduced number of manufacturing steps related to winding operation, to thereby enable to reduce the manufacturing cost.

To attain above objects, the present invention provides a resolver system which includes a resolver having an annular rotor, and an annular stator arranged around the annular rotor in spaced relationship thereto, the rotor and the stator being arranged such that the reluctance of a space defined between the rotor and the stator varies with a change in the angular position of the rotor in such a fashion that one revolution of the rotor causes one cycle of a fundamental frequency component of variation of the reluctance.

The resolver system according to the invention is characterized by an improvement wherein:

the stator has formed thereon a plurality of pole shoes circumferentially arranged at intervals of 120° or 60° to form three or six phases, each of the pole shoes having a single kind of winding wound thereon, and the resolver system comprises:

excitation means for applying an excitation signal to each of the windings on the pole shoes of the stator to excite same, and signal processing means responsive to a value of current flowing in each of the windings which is variable with variation of the reluctance, for generating a speed signal indicative of the rotational speed of the rotor and a position signal indicative of the angular position of the rotor.

By virtue of the above arrangement, a small space suffices for accommodating only one kind of winding wound on each of the pole shoes of the stator, making it possible to design the whole resolver system compact in size as well as facilitate the assemblage of the system into or with a driving motor or the like. Besides, no insulating operation is required unlike the case of insulating two kinds of windings from each other, enabling to reduce the number of manufacturing steps related to winding operation which is conventionally complicated to perform, and hence reduce the manufacturing cost.

Further, according to the resolver system of the invention, the pole shoes of the stator comprise a first group of pole shoes forming three or six phases (A, B, C), and a second group of pole shoes arranged at locations diametrically opposite to respective ones of the first group of pole shoes and forming three or six phases ($\overline{A}, \overline{B}, \overline{C}, \ldots$), each of the pole shoes having a single kind of winding wound thereon, each of the phases of the first and second groups being formed by a plurality of ones of the pole shoes.

By virtue of this arrangement, the stator has an increased total number of pole shoes, which makes it possible to finely detect changes in the current flowing in the windings of the pole shoes dependent upon reluctance variation, so that errors in the reluctance variation, which can be affected by machining tolerances of the inside and outside diameters of the stator 31, burrs or the like on the outer peripheral surface of the rotor 30, which are formed during machining operation, are averaged to thereby enhance the accuracy of detection of the angular position $\theta$.

Still further, according to the resolver system of the invention, the signal processing means comprises a servo driver responsive to a value of current flowing in the windings of each of the phases for generating the speed signal and the position signal, and control means for processing the position signal to generate an angular position signal indicative of the angular position of the rotor.

The servo driver comprises a current-to-voltage converter for converting a value of current flowing in the windings of the each phase to generate a voltage signal indicative of a voltage applied to the windings of the each phase, a subtracter for subtracting the voltage signal from the converter indicative of a voltage applied to the windings of each of the phases of the second group from the voltage signal from the converter indicative of a voltage applied to the windings of a corresponding one of the phases of the first group to generate a three- or six-phase voltage signal, a 3 or 6 phase-to-2 phase converter for converting the three- or six-phase voltage signal to a two-phase voltage signal, and a resolver-to-digital converter responsive to the two-phase voltage signal from the 3 or 6 phase-to-2 phase converter for generating an analog speed signal and a digital position signal.

The resolver-to-digital converter employs a tracking-type signal processing which converts the two-phase voltage signal from the 3 or 6 phase-to-2 phase converter to the digital position signal.

By virtue of the use of the tracking-type signal processing, high accuracy of resolver signal-to-digital conversion can be achieved.

The above and other objects, features, and advantages of the invention will be more apparent from the following detailed description taken in conjunction with the accompanying drawings.

BRIEF DESCRIPTION OF THE DRAWINGS

FIG. 6(a) shows a waveform of a voltage signal (A-phase signal) converted from a current signal from windings of a phase A of the unipolar resolver;

FIG. 6(b) shows a waveform of a voltage signal ($\overline{A}$-phase signal) converted from a current signal from windings of a phase $\overline{A}$ of the unipolar resolver;

FIG. 7(a) shows a waveform of a cos signal in the form of a two-phase signal converted from a three-phase resolver signal from the unipolar resolver;

FIG. 7(b) shows a waveform of a sin signal in the form of a two-phase signal converted from the three-phase resolver signal;

FIG. 8 is a schematic block diagram showing the arrangement of a resolver-to-signal converter in FIG. 3; and FIGS. 9(a) and 9(b) are timing charts showing the respective timing relationships between a digital-converted multi-polar resolver signal and a digital-converted unipolar resolver signal.

DETAILED DESCRIPTION

The invention will now be described in detail with reference to the drawings showing an embodiment thereof.

Figure 3:
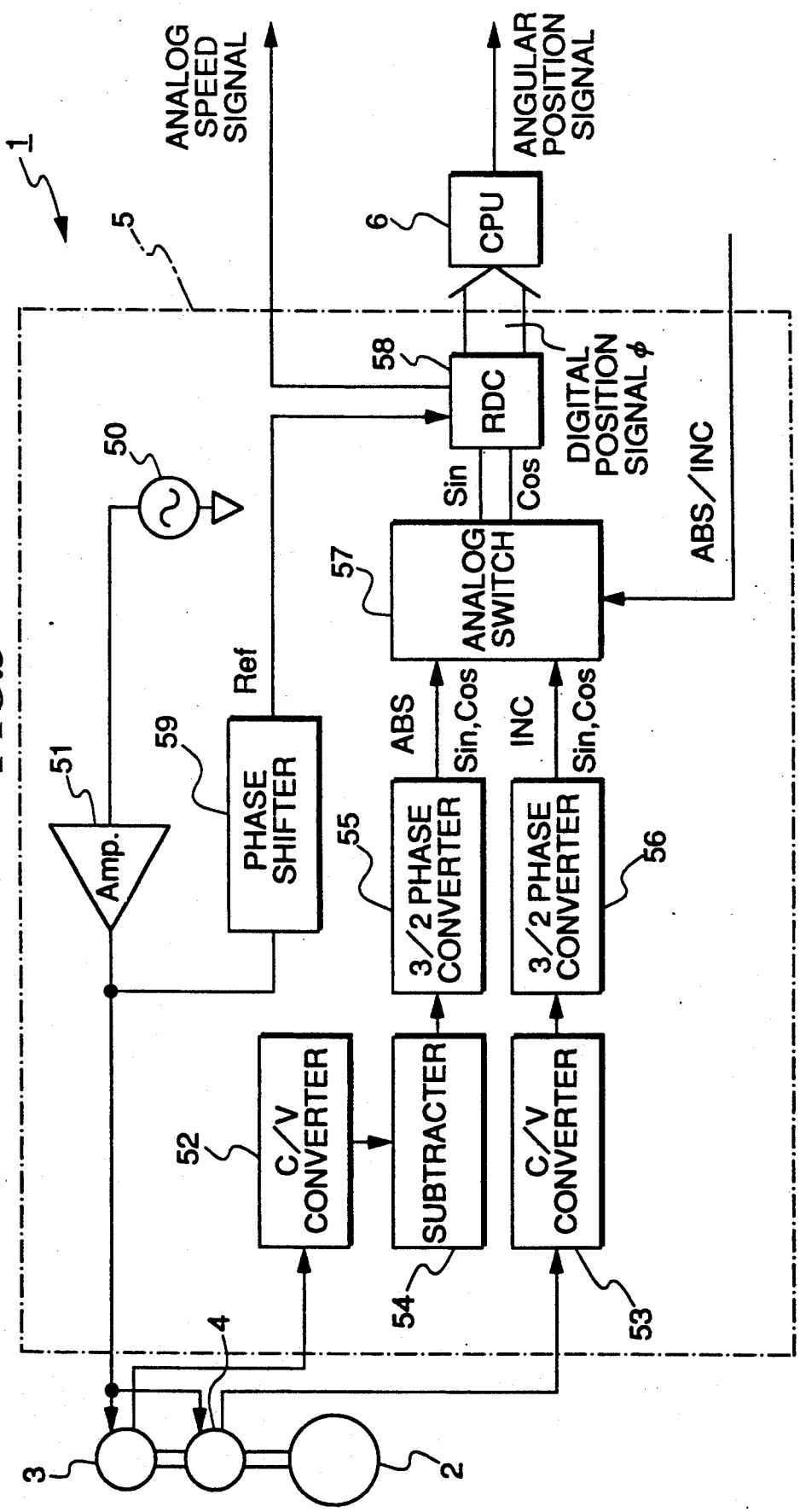
FIG. 3 is a schematic block diagram showing the arrangement of the resolver system.

Referring first to FIG. 3, there is shown a resolver system according to an embodiment of the invention. As shown in FIG. 3, the resolver system 1 is comprised of a Megatorque motor 2 ("Megatorque" is a registered trademark), a unipolar resolver 3, a multi-polar resolver 4, the resolvers 3, 4 having respective rotors, not shown, coupled to a rotor, not shown of the Megatorque motor 2 (alternatively the resolvers 3, 4 may be incorporated into the interior of the motor 2 with their rotors combined in one body with the rotor of the motor 2), a servo driver 5 which supplies a common excitation signal to the resolvers 3, 4, and sense values of current flowing in windings of the resolvers 3, 4 to detect a digital position signal $\phi$ and an analog speed signal from the sensed current values, and control means (CPU) 6 which is formed by a microcomputer and which calculates the angular position of the rotor of the Megatorque motor 2 from the digital position signal $\phi$ from the servo driver 5 and generates an angular position signal indicative of the calculated angular position.

Figure 1:
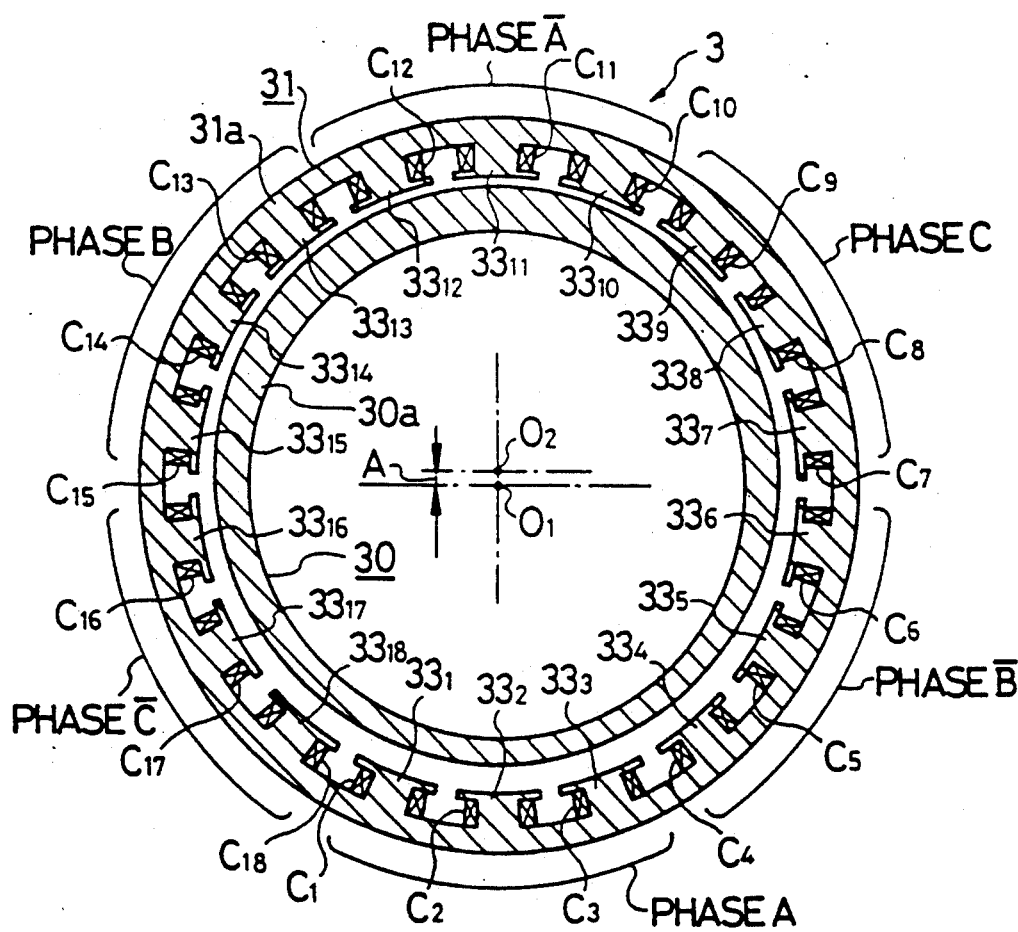
FIG. 1 is a transverse cross-sectional view of a unipolar resolver employed in a resolver system according to an embodiment of the invention.

The unipolar resolver 3 is a three-phase variable reluctance type resolver as shown in FIG. 1, which is formed of an annular rotor 30 and an annular stator 31 which are arranged such that the reluctance of a space 32 defined between a rotor core 30a and a stator core 31a varies with a change in the angular position of the rotor core 30a in such a fashion that one cycle of a fundamental wave of reluctance variation is caused by one revolution of the rotor core 30a. More specifically, the inside diameter center $O_1$ of the rotor 30 coincides with the inside diameter center of the stator 31, but the wall thickness of the rotor core 30a varies along the whole circumference such that the outside diameter center $O_2$ of the rotor 30 is deviated from the inside diameter center $O_1$ thereof by a certain amount A. Accordingly, the reluctance of the space 32 between the rotor core 30a and the stator core 31a varies as the rotor core 30a rotates.

Figure 2:
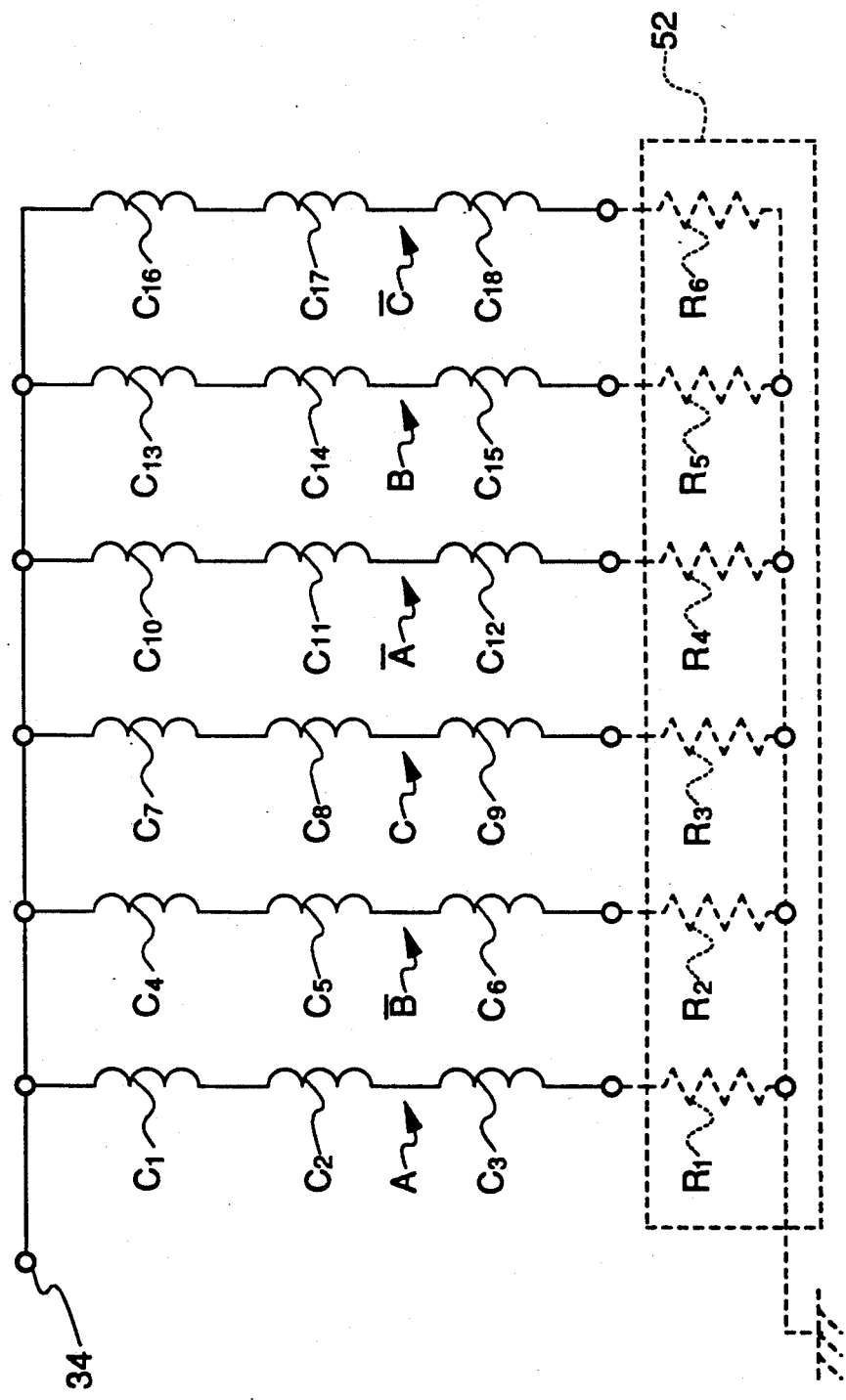
FIG. 2 shows an electrical connection of windings wound on pole shoes of the unipolar resolver.

The stator 31 is formed integrally with pole shoes 33 for forming three phases A, B, and C circumferentially arranged at equal intervals of 120°, and further pole shoes 33 for forming three phases $\overline{A}$, $\overline{B}$, and $\overline{C}$ arranged at diametrically opposite locations to respective ones of the phases A, B and C. Each of these phases A, B, C, $\overline{A}$, $\overline{B}$, and $\overline{C}$ is formed by three pole shoes 33 so that 18 pole shoes $33_1$–$33_{18}$ are formed on the stator 31. The pole shoes $33_1$–$33_{18}$ are surrounded, respectively, by a single kind of coils (windings) $C_1$–$C_{18}$. As shown in FIG. 2, the three coils $C_1$, $C_2$, and $C_3$ of the phase A are serially connected to each other, and so are the coils of each of the other phases. The serially connected coils $C_1$–$C_3$ of the phase A are connected between a common terminal 34 and a voltage-detecting resistance $R_1$. Similarly, the coils of each of the other phases are connected between the common terminal 34 and an end of a voltage-detecting resistance $R_2$–$R_6$ with its other end grounded.

With the above described arrangement of the unipolar resolver 3, when a sinusoidal wave signal having a certain frequency is supplied as an excitation signal to the common terminal 34, AC signals are generated over one cycle from the coils of the respective phases A–C, with a phase difference of 120° between the adjacent phases A–C whenever one revolution of the rotor 30 is completed, as three-phase unipolar resolver signals each having a current value variable with a change in the reluctance. Meanwhile, three-phase unipolar resolver signals are also similarly generated from the coils of the phases $\overline{A}$, $\overline{B}$, and $\overline{C}$, with a phase difference of 180° with respect to the signals from the respective phases A, B, and C.

Figure 4:
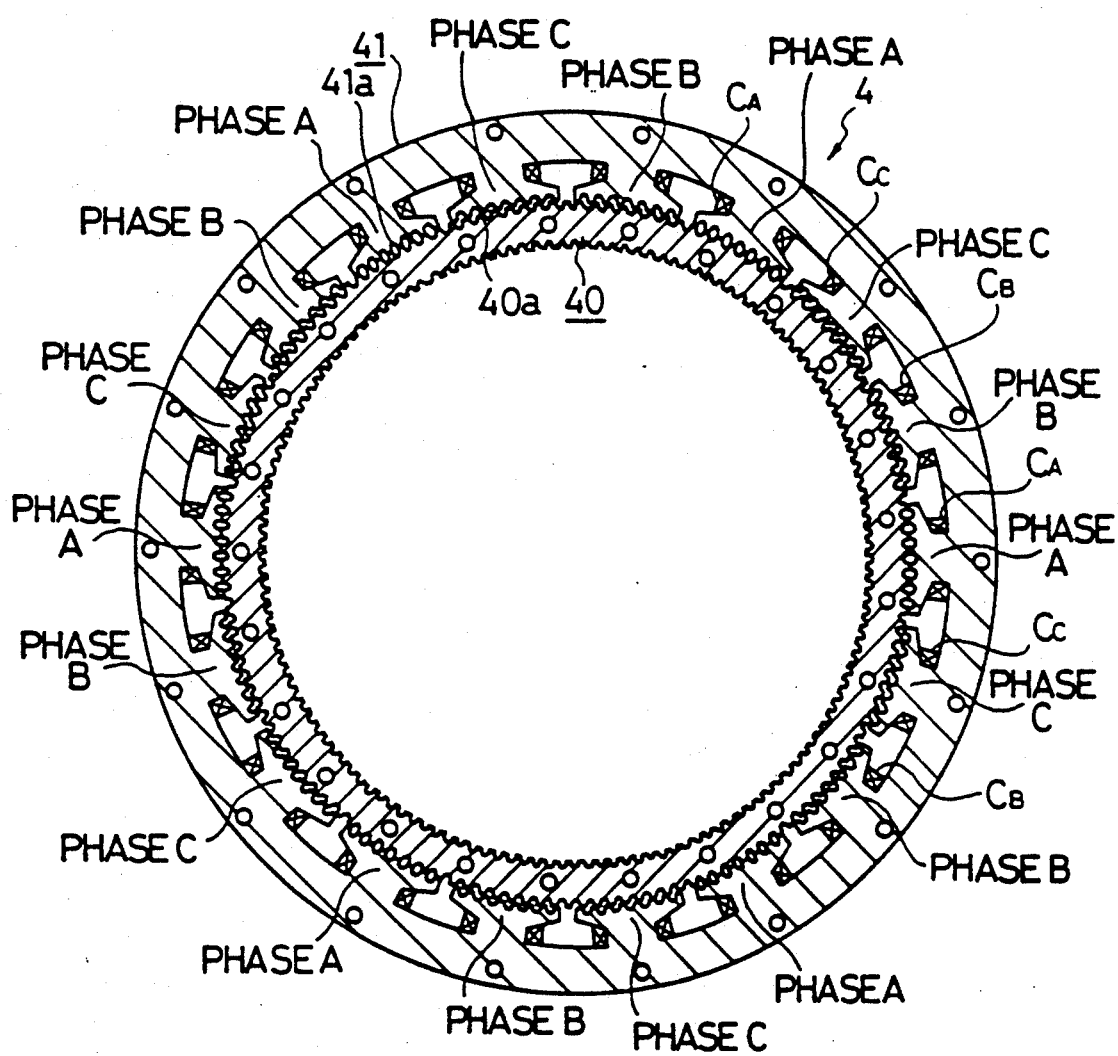
FIG. 4 is a transverse cross-sectional view showing a multi-polar resolver employed in the resolver system.
Figure 5:
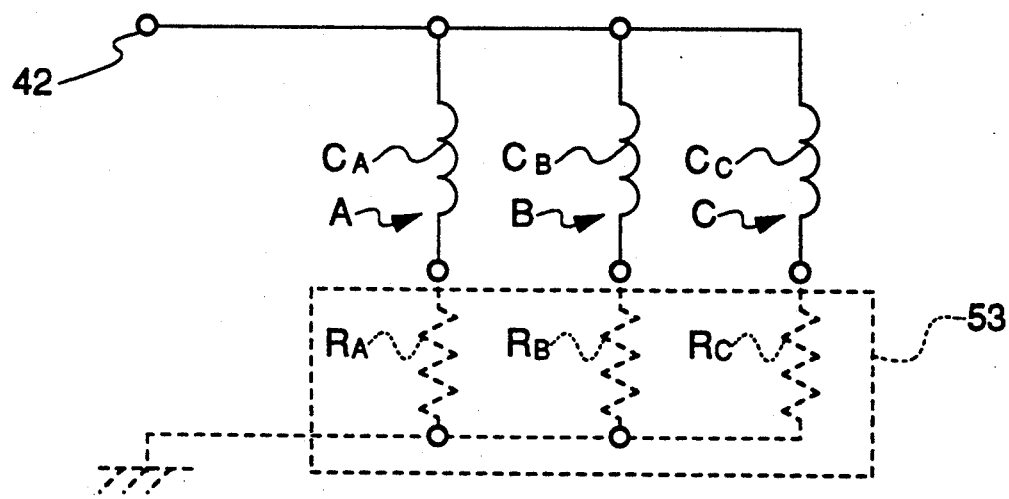
FIG. 5 shows an electrical connection of windings wound on pole shoes of the multi-polar resolver.

The multi-polar resolver 4 is shown in detail in FIG. 4. It is formed of a cylindrical rotor 40, and a stator 41, which are arranged such that the outside diameter center of the rotor 40 coincides with the inside diameter center of the stator 41. The rotor 40 has its outer peripheral surface formed integrally with a multiplicity of (e.g. 150) pole shoe teeth 40a. The stator 41 has an inner peripheral portion thereof formed integrally with a plurality of pole shoes for forming as many phases A, B, and C in groups, respectively, and circumferentially arranged at equal intervals such that the phases A, B, and C of each group are arranged in the order mentioned. The pole sloes of the phases A, B, and C are surrounded, respectively, by coils $C_A$, $C_B$, and $C_C$. The stator 41 has its inner peripheral surface formed integrally with a multiplicity of (e.g. 144 in the case of the number of the rotor teeth 40a is 150) pole shoe teeth 41a which are arranged so as to provide an electric phase difference of 120° between the phases A, B, and C. The coils $C_A$, $C_B$, and $C_C$ of the phases A, B, and C are connected between a common terminal 42 and ends of respective voltage-detecting resistances $R_A$, $B_B$, and $R_C$ with their other ends grounded, as shown in FIG. 5.

With the above described arrangement of the multi-polar resolver 4, when a sinusoidal wave signal having a certain frequency is supplied as an excitation signal to the common terminal 42, AC signals having 150 cycles corresponding to the number of the pole shoe teeth 40a are generated from the respective coils $C_A$, $C_B$, and $C_C$ as multi-polar resolver signals corresponding to respective phases A, B, and C, whenever one revolution of the rotor 40 is completed.

The servo driver 5 includes a generator 50 which generates a sinusoidal wave signal having e.g. 6 KHZ, and an amplifier 51 which amplifies the sinusoidal wave signal from the generator 50 and supplies the amplified signal as an excitation signal to the common terminals 34, 42 of the unipolar resolver 3 and multi-polar resolver 4 at the same time. By thus supplying the common excitation signal to the common terminals 34, 42 of the resolvers 3, 4 for exciting the coils thereof at the same time, magnetic interference can be prevented. The servo driver 50 further includes a pair of current-to-voltage (C/V) converters 52, 53, a subtracter 54, a pair of 3 phase-to-2 phase (3/2 phase) converters 55, 56, an analog switch 57, a resolver-to-digital converter (RDC) 58, and a phase shifter 59.

The C/V converter 52 comprises the aforementioned voltage-detecting resistances $R_1$–$R_6$ and converts current signals flowing in the coils of the phases A, B, C, $\overline{A}$, $\overline{B}$, and $\overline{C}$ of the unipolar resolver 3 to voltage signals. More specifically, the following voltage signals are supplied from the C/V converter 52 to the subtracter 54:

$A$ phase signal $=(A_0+A_1\cos\theta)\cdot\sin\omega t$ $\overline{A}$ phase signal $=(A_0-A_1\cos\theta)\cdot\sin\omega t$ $B$ phase signal $=\{A_0+A_1\cos(\theta+2/3\pi)\}\cdot\sin\omega t$ $\overline{B}$ phase signal $=\{A_0-A_1\cos(\theta+2/3\pi)\}\cdot\sin\omega t$ $C$ phase signal $=\{A_0+A_1\cos(\theta+4/3\pi)\}\cdot\sin\omega t$ $\overline{C}$ phase signal $=\{A_0-A_1\cos(\theta+4/3\pi)\}\cdot\sin\omega t$ where $\omega=2\pi f$, and $A_0$ and $A_1$ represent values of amplitude determined by the space 32 between the rotor 30 and the stator 31 and the deviation amount A, $\theta$ the angular position of the rotor 30, and f represents the carrier frequency. The A phase signal is shown in FIG. 6(a), and the $\overline{A}$ phase signal in FIG. 6(b).

The subtracter 54 carries out subtractions as follows and supplies the following resulting voltage signals (i)–(iii) to the 3/2 phase converter 55 as three-phase unipolar resolver signals ABS:

$A$ phase $-\overline{A}$ phase $=2A_1\cos\theta\cdot\sin\omega t$       (i)

$B$ phase $-\overline{B}$ phase $=2A_1\cos\theta(\theta+2/3\pi)\cdot\sin\omega t$       (ii)

$C$ phase $-\overline{C}$ phase $=2A_1\cos(\theta+4/3\pi)\cdot\sin\omega t$       (iii)

The C/V converter 53 comprises the aforementioned voltage-detecting resistances $R_A$, $B_B$, and $R_C$, converts current signals flowing in the coils of the phases A, B, and C of the multi-polar resolver 4 to rottage signals (three-phase AC signals) and supplies the same voltage signals to the 3/2 phase converter 56 as three-phase multi-polar resolver signals INC.

The 3/2 phase converter 55 converts the above three-phase signals ABS (i)–(iii) to two-phase signals (a cos signal and a sin signal given below) and supplies these two phase signals to the analog switch 57:

$\cos$ signal $=K\cdot\cos\theta\cdot\sin\omega t$ $\sin$ signal $=K\cdot\cos\theta\cdot\sin\omega t$ where K is a constant which may be determined by the amplitude values $A_0$ and $A_1$. The cos signal is shown in FIG. 7 (a), and the sin signal in FIG. 7 (b).

The other 3/2 phase converter 56 has the same function as the 3/2 phase converter 55, i.e. it converts the three-phase multi-polar resolver signals INC from the C/V converter 53 to two-phase signals INC (cos signal and sin signal), and supplies the signals INC to the analog switch 57.

The analog switch 57 is adapted to be switched in response to an ABS/INC changeover signal from the CPU 6 such that only when power supply to the servo driver 5 has been turned on or started, the two-phase signals ABS from the 3/2 phase converter 55 are selected to pass through the analog switch 57, and thereafter only the two-phase signals INC from the 3/2 phase converter 56 are allowed to pass through the analog switch 9.

The phase shifter 59 functions to delay the phase of the excitation signal from the amplifier 51 and applies a signal Ref (sin $\omega t$) synchronized in phase with the two-phase signals ABS or INC to the RDC 58 to cancel carrier signal components in the cos signal and sin signal of the signals ABS or INC by synchronous rectification.

The RDC 58, which is sold on the market, converts the two-phase signals ABS and INC to digital signals. If a 12 bit-type converter is used as the RDC 58, the two-phase signals ABS are converted to a digital position signal $\phi$ composed of 4096 pulses per revolution of the rotor 30 (i.e. by dividing one revolution of the rotor 30 by $2^{12}$). That is, this digital position signal $\phi$ represents a digital value obtained by counting from 0 up to 4095 during one revolution of the rotor 30 of the unipolar resolver 3 (FIG. 9 (b)).

On the other hand, the two-phase signals INC, if the RDC 58 is a 12 bit type, are converted to a digital position signal $\phi$ composed of 614400 pulses per revolution of the rotor 40 (=4096×150 (number of teeth 40a) (i.e. by dividing the angle corresponding to each of 150 teeth 40a by $2^{12}$). This digital position signal $\phi$ represents a digital value obtained by counting from 0 up to 4095 150 times during one revolution of the rotor 40 of the multi-polar resolver 4 (FIG. 9 (a)).

More specifically, as shown in FIG. 8, the RDC 58 comprises a high-speed sin-to-cos multiplier 81, a subtracter 82, an error amplifier 83, a synchronous rectifier 84, an integrator 85, a voltage-to-frequency converter (VCO) 86, a counter 87, and a digital-to-analog (D/A) converter 88.

The high-speed sin/cos multiplier 81 subjects the cos signal and sin signal of the two-phase signals ABS or INC to multiplication of $\cos \theta \times \sin \omega t \times \cos \phi$, and $\sin \theta \times \sin \omega t \times \sin \phi$, provided that the cos signal $= \cos \theta \times \sin \omega t$, and the sin signal $= \sin \theta \times \sin \omega t$, and applies the resulting products to a positive input terminal of the subtracter 82, and a negative input terminal of same, respectively. The multipliers $\cos \phi$ and $\sin \phi$ are two-phase analog values obtained by digital-to-analog conversion of a count value $\phi$ from the counter 87 by the D/A converter 88.

The subtracter 82 carries out the following subtraction:

$$\cos \theta \times \sin \omega t \times \cos \phi - \sin \theta \times \sin \omega t \times \sin \phi = \sin \omega t \times \sin (\theta - \phi)$$

The resulting difference is applied via the error amplifier 83 to the synchronous rectifier 84, which, on the other hand, is supplied with the signal Ref (sin $\omega$ t) from the phase shifter 59, whereby the carrier signal components (sin $\omega$ t) are cancelled, and accordingly the synchronous rectifier 84 generates a signal sin $(\theta - \phi)$ and applies same to the integrator 85.

The integrator 85 integrates the signal sin $(\theta - \phi)$, and applies the resulting analog speed signal to display means, not shown, as well as to the VCO 86.

The VCO 86 generates a pulse train of a frequency corresponding to the voltage value of the analog speed signal and applies same to the counter 87, which in turn counts pulses of the pulse train from the VCO 86.

In the RDC 58, a servo system formed by the high-speed sin/cos multiplier 81 through the D/A converter 88 employs a tracking-type signal processing that the above calculation operation is carried out until sin $(\theta - \phi) = 0$, i.e. $\theta = \phi$. When $\theta = \phi$, the count value of the counter 87 then assumed is supplied to the CPU 6 as the digital position signal $\phi$.

Then, the CPU 6 adapts as a term abs (FIG. 9 (b)) the value of the digital position signal $\phi$ obtained from the cos signal and sin signal of the two-phase signals ABS by the RDC 58, and adapts as a term inc the value of the digital position signal $\phi$ obtained from the cos signal and sin signal of the two-phase signals INC by the RDC 58, and carries out a calculation of abs$\times$150+(2048−inc)+offset to determine the angular position of the rotor 30.

In the above formula, the terms abs, inc are values falling between 0 and 4095 (provided that the RDC 58 is a 12 bit type), and offset represents a deviation between a zero position value of abs and a zero position value of inc, e.g. 100. At the time point the value inc is reset from 4095 to 0, there occurs a shift from one tooth 40a of the rotor 40 to the next tooth 40a. An error in the vicinity of this 0 value position can lead to an error of an amount corresponding to one whole tooth 40a. To prevent this, in the above formula it is assumed that there occurs a shift from one tooth 40a to the next one at the time point the value inc reaches 2048 (nearly the middle value between 0 and 4095).

The term abs$\times$150 in the formula is provided to match the scale of abs to the scale of inc to determine which tooth of the 150 teeth 40a the value inc corresponds to. The term (2048−inc) is provided to determine a present point on one tooth 40a determined above by the term abs$\times$150.

Next, the operation of this embodiment will be described.

When the rotor of the Megatorque motor 2 (i.e. the rotors 30, 40 of the resolvers 3, 4) has been rotated to a certain angular position, current flows in the coils of each of the phases A, B, C, $\overline{A}$, $\overline{B}$, and $\overline{C}$ of the unipolar resolver 3, which varies with reluctance variation as a function of the angular position $\theta$. Six current signals from these coils are successively converted to voltage signals by the C/V converter 52. The voltage signals from the C/V converter 52 are successively applied to the subtracter 54, which carries out subtractions based upon the input voltage signals in the aforesaid manner to supply the resulting voltage signals (i)–(iii) as aforementioned, as three-phase signals ABS to the 3/2 phase converter 55. The three-phase signals ABS are converted to two-phase signals ABS (cos signal and sin signal) by the 3/2 phase converter 55, and the two-phase signals ABS are applied to the analog switch 57.

Meanwhile, AC signals are successively generated from the respective coils $C_A$, $C_B$, and $C_C$ of the phases A, B, and C of the multi-polar resolver 4, which each have cycles corresponding to the angular position $\theta$ of the rotor 40. The AC signals are successively converted to three-phase voltage signals INC by the C/V converter 53, which are then converted to two-phase signals INC (cos signal and sin signal) by the 3/2 phase converter 56. The two-phase signals INC are applied to the analog switch 57.

The analog switch 57 selects the two-phase signals ABS from the 3/1 phase converter 55 to pass therethrough only when power supply to the servo driver 5 has been turned on, and thereafter selects only the two-phase signals INC from the 3/2 phase converter 56 to pass therethrough.

The RDC 58 converts each two-phase signal ABS applied thereto to a digital positon signal $\phi$ in the aforedescribed manner, and applies the signal $\phi$ to the CPU 6. At this time, the signal $\phi$ applied to the CPU 6 assumes a value of abs.

Thereafter, the RDC 58 converts each two-phase signal INC applied thereto a digital position signal $\phi$ in the aforedescribed manner, and applies the signal $\phi$ to the CPU 6. This signal $\phi$ applied to the CPU 6 assumes a value of inc.

Then, the CPU 6 applies the values of abs and inc to the formula of abs$\times$150+(2048−inc)+offset to calculate the angular position $\theta$. Provided that abs=2,000, and inc=3,000, for example, the above formula becomes 3,000+(−952)+100=299148. The angular position $\theta$ of the rotor of the motor 2, i.e. the rotor 30 can be determined by multiplying 299148 by 360°/614400.

In this way, according to this embodiment, by using both the unipolar resolver 3 and the multi-polar resolver 4 the angular position $\theta$ of the rotor 30 can be determined with high accuracy.

The resolution of detection of the angular position $\theta$ of the resolver system 1 according to the above described embodiment is as follows:

If the RDC 58 is a 12 bit type,

Provided that the rotor 40 of the multi-polar resolver 4 has 150 teeth 40a, the resolution is 614400 (pulses per one revolution);

Provided that the rotor 40 has 120 teeth 40a, the resolution is 491520 (pulses per one revolution);

Provided that the rotor 40 has 100 teeth 40a, the resolution is 409600 (pulses per one revolution).

If the RDC 58 is a 14 bit type, the resolution is four times as high as that in the case of the RDC 58 being a 12 bit type.

According to the above described embodiment, by virtue of the structure of the unipolar resolver 3 that each of the phases A, B, C, $\overline{A}$, $\overline{B}$, and $\overline{C}$ is provided with three magnetic poles and the phases $\overline{A}$, $\overline{B}$, and $\overline{C}$ are arranged at locations diametrically opposite to respective ones of the phases A, B, and C, errors in the reluctance variation, which can be affected by machining tolerances of the inside and outside diameters of the stator 31, and burrs or the like on the outer peripheral surface of the rotor 30, which are formed during machining operation, are averaged to thereby enhance the accuracy of detection of the angular position $\theta$. The number of pole shoes provided for each of the phases A, B, C, $\overline{A}$, $\overline{B}$, and $\overline{C}$ is not limited to three as in the above described embodiment, but it may be two, for example.

Further, since in the above described embodiment, the servo system of the RDC 58 employs a tracking type signal processing as described above, high accuracy of resolver signal-to-digital conversion can be achieved with easiness.

Although the unipolar resolver 3 and the multi-polar resolver 4 have three-phase structures, they may have six-phase structures.

What is claimed is:

1. A resolver system comprising:

a resolver having an annular rotor, and an annular stator arranged around said annular rotor in spaced relationship thereto, said rotor and said stator being arranged such that the reluctance of a space defined between said rotor and said stator varies with a change in an angular position of said rotor such that one revolution of said rotor causes one cycle of a fundamental frequency component of variation of the reluctance, said stator having formed thereon a plurality of pole shoes circumferentially arranged at intervals of 120" or 60" to form three or six phases, respectively, each of said pole shoes having a single kind of winding wound thereon, said pole shoes of said stator comprise a first group of pole shoes for forming three or six phases (A, B, C), and a second group of pole shoes arranged at locations diametrically opposite to respective ones of said first group of pole shoes for forming three or six phases ($\overline{A}$, $\overline{B}$, $\overline{C}$, . . . ), each of said pole shoes having a single kind of winding wound thereon, and each of said phases of said first and second groups of pole shoes being formed by a plurality of ones of said pole shoes, said resolver system further comprising:

excitation means for applying an excitation signal to each of said windings on said pole shoes of said stator to excite same, and signal processing means responsive to a value of current flowing in each of said windings which is variable with variation of the reluctance, for generating a speed signal indicative of the rotational speed of said rotor and a position signal indicative of the angular position of said rotor, said signal processing means comprising a servo driver responsive to the value of current flowing in said windings of each of said phases for generating said speed signal and said position signal, and control means for processing said position signal to generate an angular position signal indicative of the angular position of said rotor, and said servo driver comprising a current-to-voltage converter for converting the value of current flowing in the windings of said each phase to generate a voltage signal indicative of a voltage applied to said windings of said each phase, a subtracter for subtracting said voltage signal from said converter indicative of a voltage applied to said windings of each of said phases of said second group of pole shoes from said voltage signal from said converter indicative of a voltage applied to said windings of a corresponding one of said phases of said first group of pole shoes to generate a three- or six-phase voltage signal, a 3 or 6 phase-to-2 phase converter for converting said three- or six phase voltage signal to a two-phase voltage signal, and a resolver-to-digital converter responsive to said two-phase voltage signal from said 3 or 6 phase-to-2 phase converter for generating an analog speed signal and a digital position signal.

2. A resolver system as claimed in claim 1, wherein said resolver-to-digital converter comprises a tracking-type signal processing means for converting said two-phase voltage signal from said 3 or 6 phase-to-2 phase converter to said digital position signal.

3. A resolver system as claimed in claim 2, wherein said digital position signal represents a predetermined number of pulses indicative of information on said angular position, said predetermined number of pulses being obtained by dividing one revolution of said rotor of said resolver by a value dependent on the ability of said resolver-to-digital converter.

4. A resolver system as claimed in claim 1, wherein said digital position signal represents a predetermined number of pulses indicative of information on said angular position, said predetermined number of pulses being obtained by dividing one revolution of said rotor of said resolver by a value dependent on the ability of said resolver-to-digital converter.

5. In a resolver system including a unipolar resolver having an annular rotor, and an annular stator arranged around said annular rotor in spaced relationship thereto, said rotor and said stator being arranged such that the reluctance of a space defined between said rotor and said stator varies with a change in an angular position of said rotor such that one revolution of said rotor causes one cycle of a fundamental frequency component of variation of the reluctance, the improvement wherein:

said stator of said unipolar resolver has formed thereon a plurality of pole shoes circumferentially arranged at intervals of 120° or 60° to form three or six phases, respectively each of said pole shoes having a single kind of winding wound thereon, and said resolver system further comprising:

a multi-polar resolver having an annular rotor, rotatable together with said rotor of said unipolar resolver, and an annular stator arranged around said annular rotor, said rotor having an outer peripheral surface thereof formed with a multiplicity of pole shoe teeth, said stator having an inner peripheral surface thereof formed with a multiplicity of pole shoe teeth, said stator having an inner peripheral portion formed with a plurality of pole shoes having a plurality of windings wound thereon, respectively, to form three or six phases, wherein an AC signal having cycles corresponding to the number of said pole shoe teeth formed on said rotor of said multi-polar resolver is generated from each of said windings as a multi-polar resolver signal corresponding to each of said phases, whenever one revolution of said rotor is completed, excitation means for applying an excitation signal to each of said windings of each of said unipolar resolver and said multi-polar resolver to excite same, and signal processing means responsive to an AC signal having one cycle and generated at each of said phases of said unipolar resolver as a unipolar resolver signal indicative of a value of current flowing in each of said windings which is variable with variation of the reluctance, and said multi-polar resolver signal, for generating a speed signal indicative of the rotational speed of said rotors and a position signal indicative of the angular position of said rotors.

6. A resolver system as claimed in claim 5, wherein said pole shoes of said stator of said unipolar resolver comprise a first group of pole shoes for forming three or six phases (A, B, C), and a second group of pole shoes arranged at locations diametrically opposite to respective ones of said first group of pole shoes for forming three or six phases ($\overline{A}, \overline{B}, \overline{C}, \ldots$), each of said pole shoes having a single kind of winding wound thereon, and each of said phases of said first and second groups being formed by a plurality of ones of said pole shoes.

7. A resolver system as claimed in claim 5, wherein said signal processing means comprises a servo driver responsive to said unipolar resolver signal for generating a first position signal having information on said angular position, and responsive to said multi-resolver signal for generating a second position signal having information on said angular position, and said speed signal, and control means for processing said first and second position signals to generate angular position signals indicative of the angular position of said rotors.

8. A resolver system as claimed in claim 7, wherein said servo driver comprises a first current-to-voltage converter for converting said unipolar resolver signal being an three- or six-phase AC signal to generate a voltage signal indicative of a voltage applied to said windings of said each phase of said unipolar resolver, a subtracter for subtracting said voltage signal from said converter indicative of a voltage applied to said windings of each of said phases of said second group from said voltage signal from said converter indicative of a voltage applied to said windings of a corresponding one of said phases of said first group to generate a three- or six-phase voltage signal, a first 3 or 6 phase-to-2 phase converter for converting said three- or six-phase voltage signal to a two-phase voltage signal, a second current-to-voltage converter for converting said multi-polar resolver signal being a three- or six-phase AC signal to a three- or six-phase voltage signal indicative of a voltage applied to the winding of each of said phases of said multi-polar resolver, a second 3 or 6 phase-to-2 phase converter for converting said three- or six-phase voltage signal to a two-phase voltage signal, and a resolver-to-digital converter responsive to said two-phase voltage signal from said first 3 or 6 phase-to-2 phase converter for generating a first digital position signal and responsive to said two-phase voltage signal from said second 3 or 6 phase-to-2 phase converter for generating a second digital position signal and an analog speed signal.

9. A resolver system as claimed in claim 8, wherein said resolver-to-digital converter comprises tracking-type signal processing means for converting said two-phase voltage signals from said first and second 3 or 6 phase-to-2 phase converters to said first and second digital position signals.

10. A resolver system as claimed in claim 9, wherein said first digital position signal represents a first predetermined number of pulses indicative of information on said angular position, said first predetermined number of pulses being obtained by dividing one revolution of said rotor of said unipolar resolver by a value dependent on the ability of said resolver-to-digital converter, said second digital position signal representing a second predetermined number of pulses indicative of information on said angular position, said second predetermined number being obtained by dividing an angle corresponding to one of said pole shoe teeth of said multi-polar resolver by a value dependent on the ability of said resolver-to-digital converter.

11. A resolver system as claimed in claim 8, wherein said first digital position signal represents a first predetermined number of pulses indicative of information on said angular position, said first predetermined number of pulses being obtained by dividing one revolution of said rotor of said unipolar resolver by a value dependent on the ability of said resolver-to-digital converter, said second digital position signal representing a second predetermined number of pulses indicative of information on said angular position, said second predetermined number being obtained by dividing an angle corresponding to one of said pole shoe teeth of said multi-polar resolver by a value dependent on the ability of said resolver-to-digital converter.

* * * * *